United States Patent
La Rosa

(10) Patent No.: US 9,941,010 B2
(45) Date of Patent: Apr. 10, 2018

(54) NON-VOLATILE MEMORY WITH A VARIABLE POLARITY LINE DECODER

(71) Applicant: STMicroelectronics (Rousset) SAS, Rousset (FR)

(72) Inventor: Francesco La Rosa, Rousset (FR)

(73) Assignee: STMicroelectronics (Rousset) SAS, Rousset (FR)

(*) Notice: Subject to any disclaimer, the term of this patent is extended or adjusted under 35 U.S.C. 154(b) by 0 days.

(21) Appl. No.: 15/365,367

(22) Filed: Nov. 30, 2016

(65) Prior Publication Data

US 2017/0084336 A1    Mar. 23, 2017

Related U.S. Application Data

(63) Continuation of application No. 14/964,196, filed on Dec. 9, 2015, now Pat. No. 9,543,018.

(30) Foreign Application Priority Data

Feb. 23, 2015  (FR) ..................... 15 51530

(51) Int. Cl.
| | |
|---|---|
| *G11C 8/10* | (2006.01) |
| *G11C 16/08* | (2006.01) |
| *G11C 16/14* | (2006.01) |
| *G11C 16/16* | (2006.01) |
| *G11C 16/26* | (2006.01) |
| *G11C 8/12* | (2006.01) |
| *G11C 8/08* | (2006.01) |

(52) U.S. Cl.
CPC ............. *G11C 16/08* (2013.01); *G11C 16/14* (2013.01); *G11C 16/16* (2013.01); *G11C 16/26* (2013.01); *G11C 8/08* (2013.01); *G11C 8/10* (2013.01); *G11C 8/12* (2013.01)

(58) Field of Classification Search
CPC ................ G11C 8/10; G11C 8/08; G11C 8/12
USPC .................. 365/230.06, 185.28, 185.29, 218
See application file for complete search history.

(56) References Cited

U.S. PATENT DOCUMENTS

| | | | |
|---|---|---|---|
| 5,901,083 | A | 5/1999 | Atsumi et al. |
| 2003/0142563 | A1* | 7/2003 | Yamano ................ G11C 29/84 365/200 |
| 2003/0198101 | A1 | 10/2003 | Pio |
| 2004/0230736 | A1 | 11/2004 | Leconte et al. |
| 2005/0105322 | A1 | 5/2005 | Kobayashi et al. |
| 2011/0096602 | A1 | 4/2011 | Kim et al. |
| 2011/0299355 | A1 | 12/2011 | Rana |

* cited by examiner

*Primary Examiner* — Jason Lappas
(74) *Attorney, Agent, or Firm* — Seed IP Law Group LLP

(57) ABSTRACT

The present disclosure relates to a memory including a memory array with at least two rows of memory cells, a first driver coupled to a control line of the first row of memory cells, and a second driver coupled to a control line of the second row of memory cells. The first driver is made in a first well, the second driver is made in a second well electrically insulated from the first well, and the two rows of memory cells are produced in a memory array well electrically insulated from the first and second wells.

19 Claims, 7 Drawing Sheets

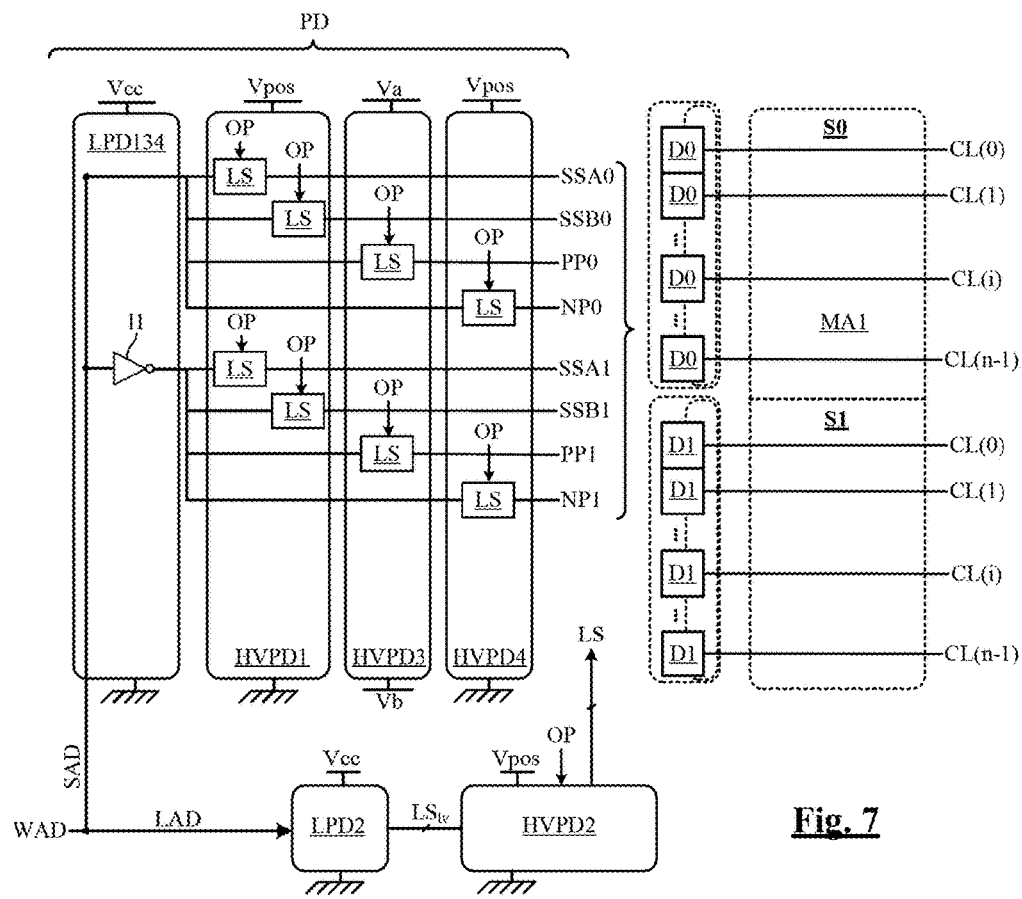
Fig. 7
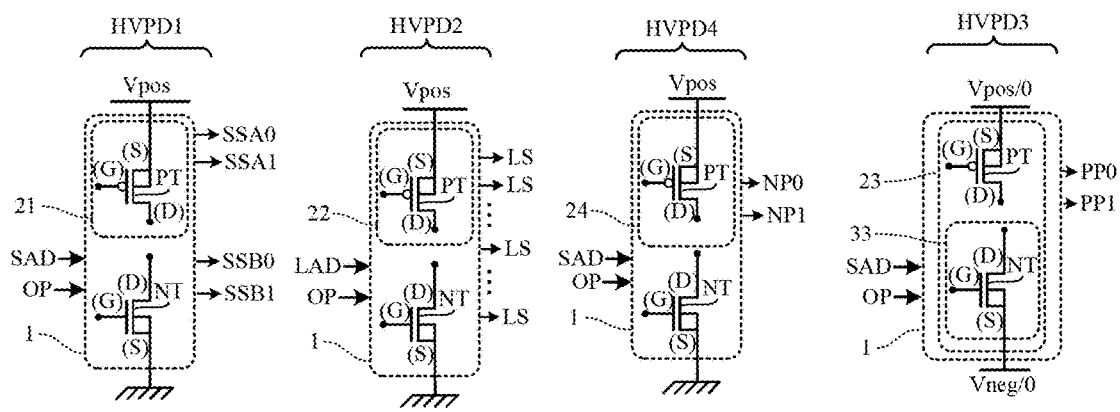
Fig. 8A  Fig. 8B  Fig. 8C  Fig. 8D

NON-VOLATILE MEMORY WITH A VARIABLE POLARITY LINE DECODER

BACKGROUND

Technical Field

The present disclosure relates to a line decoder for supplying control lines of a memory with positive or negative variable polarity voltages.

Description of the Related Art

Memories produced on CMOS (Complementary Metal-Oxide-Semiconductor) semiconductor substrate generally comprise a memory array in which memory cells are arranged in rows and in columns. The rows of memory cells are generally coupled to control lines and the columns of memory cells to bit lines.

Memory cells produced from floating-gate transistors are often erased by Fowler Nordheim effect (tunnel effect), by means of the channel erasing technique. Channel erasing requires a negative erase voltage to be applied to the control lines of the rows of memory cells that must be erased, while the substrate of the floating-gate transistors is taken to a positive voltage.

It may be desirable to simultaneously apply a positive voltage to memory cells not to be erased, to remove or limit the erasing stress of these memory cells. Such an erasing stress causes a slow spurious erasing which can lead to a full erasing of the memory cells not concerned by erasing operations. The erasing stress, if it cannot be avoided, must be managed, and requires providing a cyclical refreshing of the memory cells. This cyclical refreshing makes the structure of the memory significantly more complex and requires in particular executing a refreshing algorithm including a control of the threshold voltages of the floating-gate transistors.

The production of a line decoder capable of supplying a control line with a high value negative voltage while applying a high value positive voltage to other control lines of a memory array, for example −10V on the one hand and +10V on the other hand, comes up against various technological restrictions, in particular the fact that MOS transistors supplying such voltages cannot tolerate voltage differences greater than a breakdown voltage of these transistors, generally between 10V and 11V. It shall be recalled here that there are two types of breakdown in a MOS transistor: the breakdown of the gate oxide of the transistor and the breakdown of the junction PN or NP situated between the drain and the channel region or between the channel region and the source of the transistor. The junction breakdown generally occurs before the breakdown of the gate oxide and corresponds to a reverse-biased diode breakdown. A significant current leakage then occurs through the transistor, which causes the fall of the high erasing voltage supplied by charge pumps, generally of the order of 10V.

As a result, the voltage swing between negative and positive voltages simultaneously supplied by a conventional line decoder must not exceed the breakdown voltage of the transistors which supply these voltages. This technological limitation is found for example in the line decoder described by EP 1 441 360, which comprises terminating elements controlled by variable polarity signals supplied by group and sub-group decoders, and can simultaneously supply negative and positive voltages. As shown in FIGS. 5A to 5L of this document, which show the structure of the terminating elements, this decoder does not enable negative and positive voltages having a difference greater than the breakdown voltage of the transistors of the terminating elements to be simultaneously applied to a memory array. Thus, it is seen in Table 2, page 12 of this document, that the voltage swing never exceeds 9V.

Furthermore an architecture of sector-erasable memory array of the type schematically shown on FIG. 1 is known, in which a memory array is made up of several sectors, for example S(a), S(b), S(c), S(d), each implanted in a well electrically insulated from the wells receiving the other sectors. Each sector comprises rows of memory cells (not represented) coupled to control lines CL. The control lines of each sector are coupled to a dedicated line decoder LD(a), LD(b), LD(c), LD(d). Each line decoder is made in a well electrically insulated from the wells receiving the line decoders from other sectors, which forms the substrate of the memory cells. The sectors and their associated line decoders are thus electrically insulated from each other. This type of memory array architecture enables the well of a sector that must be erased to be biased with a positive voltage, while applying a zero voltage to the wells of the sectors not to be erased, such that their memory cells do not undergo any erasing stress. It is not therefore necessary to apply to the control lines of these sectors a negative voltage for neutralizing the erasing stress.

However, this type of memory array architecture divided into physical sectors produced in different wells occupies a semiconductor surface area that is much greater than that of an undivided memory array architecture, wherein all the memory cells are implanted in the same well and are controlled by a line decoder common to the entire memory array.

It could thus be desirable to provide a line decoder enabling lines of an undivided memory array to be simultaneously supplied with negative and positive voltages having a voltage difference greater than a breakdown voltage of transistors supplying these voltages.

BRIEF SUMMARY

Some embodiments of the disclosure thus relate to a non-volatile memory on semiconductor substrate, comprising a memory array comprising at least two rows of memory cells, a line decoder common to the entire memory array, comprising a first driver coupled to a control line of the first row of memory cells, a second driver coupled to a control line of the second row of memory cells, and a predecoder supplying the drivers with selection signals of variable polarity, either positive or negative, which are combined by the drivers to supply the control lines with control signals of variable polarity depending on the selection signals. The first driver is made in a first well, the second driver is made in a second well electrically insulated from the first well, and the two rows of memory cells are produced in a single memory array well electrically insulated from the first and second wells.

According to one embodiment, each driver is made in a well of a first conductivity type comprising at least one MOS transistor of a second conductivity type, a well of the second conductivity type implanted in the well of the first conductivity type, and at least one MOS transistor of the first conductivity type produced in the well of the second conductivity type.

According to one embodiment, the memory comprises a voltage generator circuit configured to apply to the memory array well, during the erasing of a row of memory cells, an erase voltage having a first polarity, and the first and the second drivers are configured, during the erasing of a row of memory cells, to apply to the control line of the row of memory cells to be erased an erase signal having a polarity that is the opposite of the first one, and apply to the control line of the other row of memory cells an erasing stress neutralization signal having the first polarity.

According to one embodiment, the predecoder is configured to provide the drivers with selection signals such that the erasing stress neutralization signal and the erase signal have a voltage difference greater than a breakdown voltage of transistors of the drivers.

According to one embodiment, the predecoder is configured to supply each driver with at least one signal for biasing the well in which the driver is made.

According to one embodiment, each driver comprises at least one MOS transistor of a first conductivity type having a first conduction terminal coupled to the output of the driver, a second conduction terminal receiving the well biasing signal supplied by the predecoder, and a control terminal receiving a selection signal supplied by the predecoder, and at least one MOS transistor of a second conductivity type having a first conduction terminal coupled to the output of the driver, a second conduction terminal receiving a selection signal supplied by the predecoder, and a control terminal receiving a selection signal supplied by the predecoder.

According to one embodiment, the memory array comprises at least one first sector and a second sector each comprising several rows of memory cells, and the line decoder comprises a first group of drivers produced in the first well, each coupled to a control line of a row of memory cells of the first sector, and at least one second group of drivers produced in the second well, each coupled to a control line of a row of memory cells of the second sector.

According to one embodiment, the predecoder comprises at least one predecoding circuit supplying the drivers with at least one sector selection signal, and at least one predecoding circuit supplying the drivers with at least one control line selection signal.

Some embodiments of the present disclosure also relate to an integrated circuit on a semiconductor chip, including a memory according to embodiments of the present disclosure.

Some embodiments of the present disclosure also relate to a device comprising an integrated circuit according to embodiments of the present disclosure arranged on a support.

Some embodiments of the present disclosure also relate to a method for applying control voltages to at least two rows of non-volatile memory cells, comprising the steps of forming in a first well a first driver coupled to a control line of the first row of memory cells, forming, in a second well electrically insulated from the first well, a second driver coupled to a control line of the second row of memory cells, forming the two rows of memory cells in a single memory array well electrically insulated from the first and second wells, applying to the drivers selection signals of variable polarity, either positive or negative, and combining the selection signals by means of the drivers to supply the control lines with control signals of variable polarity depending on the selection signals.

According to one embodiment, the method also comprises the steps of forming each driver in a well of a first conductivity type comprising at least one MOS transistor of a second conductivity type, a well of the second conductivity type implanted in the well of the first conductivity type, and at least one MOS transistor of the first conductivity type produced in the well of the second conductivity type.

According to one embodiment, the method comprises the step of supplying each driver with at least one signal for biasing the well in which the driver is made.

According to one embodiment of the method for applying control voltages to at least two rows of memory cells so as to erase the memory cells of one row without erasing the memory cells of the other row, the method comprises the steps of: applying to the memory array well an erase voltage having a first polarity, applying to the control line of the row of memory cells to be erased, by means of the driver of the row, an erase signal having a polarity that is the opposite of the first one, and applying to the control line of the other row of memory cells, by means of the driver of the row, an erasing stress neutralization signal having the first polarity.

According to one embodiment, the method comprises the step of supplying each driver with selection signals such that the erasing stress neutralization signal and the erase signal have a voltage difference greater than a breakdown voltage of transistors of the drivers.

According to one embodiment, the method is applied to a memory array comprising at least one first sector and a second sector each comprising several rows of memory cells, and comprises the steps of forming a first group of drivers in the first well, and coupling each driver to a control line of the first sector, forming at least one second group of drivers in the second well and coupling each driver to a control line of the second sector, applying to the drivers at least one sector selection signal, and applying to the drivers at least one control line selection signal.

BRIEF DESCRIPTION OF THE SEVERAL VIEWS OF THE DRAWINGS

Some embodiments of a memory according to the present disclosure will be described below, in relation with, but not limited to, the appended figures, in which:

FIG. 7 shows an example of an embodiment of a line decoder according to the present disclosure, FIGS. 8A to 8D very schematically show the implantation, on a substrate, of predecoding units of the line decoder.

DETAILED DESCRIPTION

Figure 2:
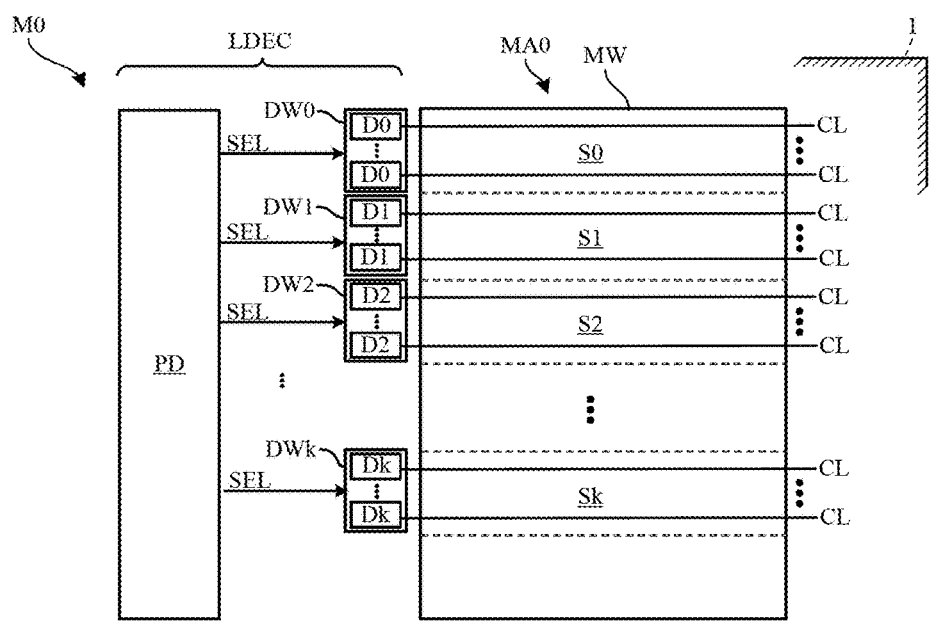

FIG. 2 schematically shows an architecture of memory M0 according to an embodiment of the present disclosure.

The memory is implanted in a semiconductor substrate 1, here of P type, and comprises a memory array MA0 comprising individually erasable sectors S0, S1, S2, . . . Sk produced in a well MW implanted on the substrate. Each sector comprises rows of memory cells (not represented) coupled to control lines CL. The control lines CL receive control voltages supplied by a line decoder LDEC. The decoder LDEC comprises a predecoder PD, drivers D0 associated with the sector S0, drivers D1 associated with the sector S1, drivers D2 associated with the sector S2, etc., each driver being coupled to a control line CL and controlled by selection signals SEL supplied by the predecoder PD. The drivers D0 coupled to control lines CL of the sector S0 are arranged in a well DW0, the drivers D1 coupled to control lines CL of the sector S1 are arranged in a well DW1, the drivers D2 coupled to control lines CL of the sector S2 are arranged in a well DW2, etc., each well being electrically insulated from the other wells.

Figure 1:
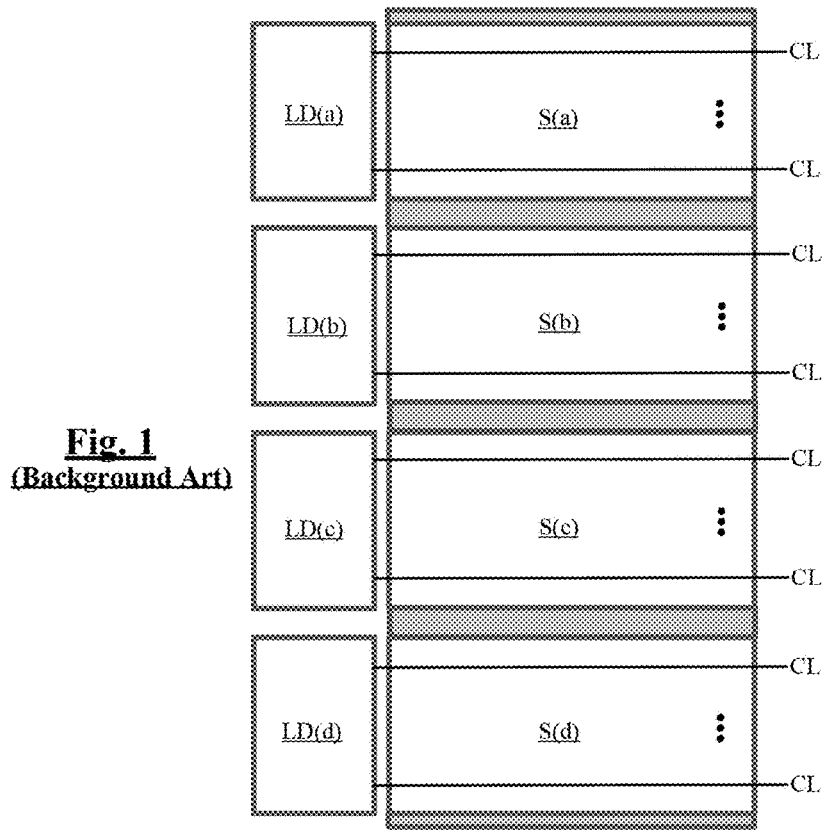
FIG. 1 described above schematically represents a conventional memory structure with a divided memory array, FIG. 2 schematically represents a memory structure with an undivided memory array according to one embodiment of the present disclosure.

The memory array is thus of the undivided type and occupies a smaller surface area than a divided memory array as shown on FIG. 1. Its breakdown into sectors is reproduced at the drivers' level, the drivers associated with sectors being produced in different wells DW. The sectors are thus here logical and non-physical sectors, and only differ from each other by the way they are controlled. The predecoder is also of the undivided type, and provides all the drivers with selection signals SEL for controlling the entire memory array MA0.

Furthermore, as will be described below, the arrangement of the drivers D0, D1, D2, etc. of the different sectors in different wells DW0, DW1, DW2, etc. enables voltages having a voltage difference greater than a breakdown voltage of transistors supplying these voltages, to be applied to control lines CL belonging to different sectors.

Figure 3:
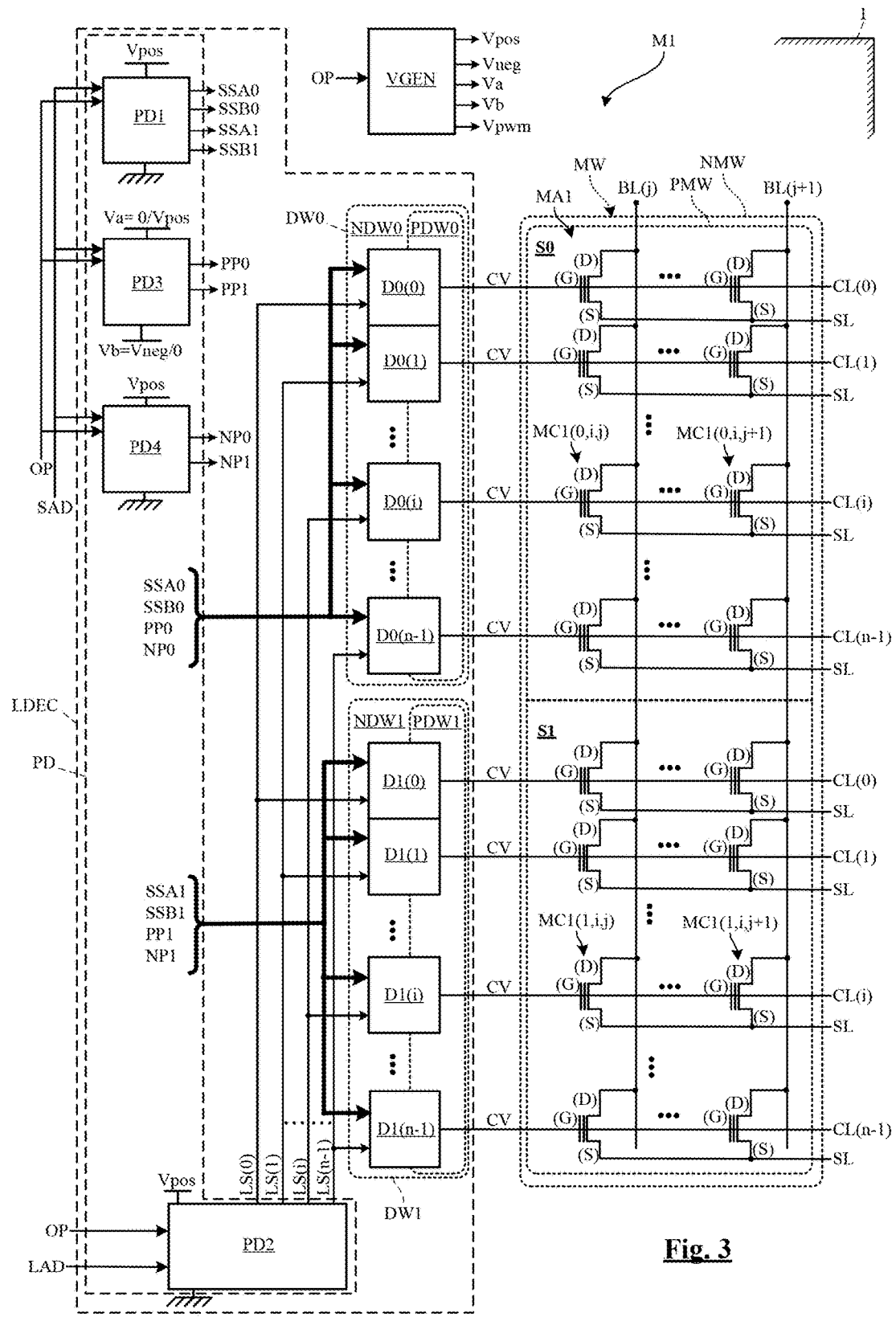
FIG. 3 shows a memory according to one embodiment of the present disclosure.

FIG. 3 shows in greater detail an example of an embodiment M1 of the memory M0 in which the number of sectors is reduced to two sectors S0, S1 to simplify the drawing. The memory array, here noted MA1, comprises memory cells MC1 arranged in rows and in columns. The memory cells are designated by a word address WAD, one word comprising a determined number of memory cells, for example 8, 16, 32, etc. Each sector S0, S1 comprises "n" control lines CL each having a determined rank "i" in the sector, "i" being an index ranging from 0 to n-1. The memory array MA1 also comprises bit lines BL(j) common to the two sectors and having a determined rank "j" in the memory array. Thus, a memory cell MC1(0,i,j) of the sector S0 situated in a row of rank "i" and in a column of rank "j", is coupled to a control line CL(i) of the sector S0 and to a bit line BL(j) of the memory array. A memory cell MC1(1,i,j) of the sector S1 situated in a row of rank "i" and in a column of rank "j", is coupled to a control line CL(i) of the sector S1 and to the same bit line BL(j) as the memory cell MC1(0,i,j). The memory cells MC1 are here floating-gate transistors having their drain terminal D coupled to the corresponding bit line BL, their control gate G coupled to the corresponding control line CL, and their source terminal S coupled to a source line SL.

The word address WAD breaks down into a sector address SAD, a line address LAD within a sector, and a column address CAD, i.e., WAD=SAD/LAD/CAD ("/" being the symbol of the concatenation). The sector SAD and line LAD addresses are applied to the line decoder LDEC. The column address CAD is applied to a column decoder not represented on FIG. 3. The sector address SAD is here the most significant bit of the word address WAD, the memory only comprising two sectors.

The well MW in which the memory cells are produced is here a P-type well PMW formed in an N-type well NMW implanted in the substrate 1. The well PMW is biased by a voltage Vpmw supplied by a voltage generating and switching circuit VGEN. The circuit VGEN also supplies voltages Vpos, Vneg, Va, Vb and receives a signal OP which indicates to it the operation being executed in the memory.

The line decoder LDEC comprises drivers D0 coupled to control lines of the sector S0 and drivers D1 coupled to control lines CL of the sector S1. Each driver D0(i) of rank "i" supplies a control line CL(i) of rank "i" of the sector S0 with a control voltage CV, and each driver D1(i) of rank "i" supplies a control line CL(i) of the same rank of the sector S1 with a control voltage CV.

The drivers D0 are implanted in a well DW0 here comprising an N-type well NDW0 and a P-type well PDW0. The drivers D1 are implanted in a well DW1 comprising an N-type well NDW1 and a P-type well PDW1. The N-type wells receive PMOS transistors (P-type MOS transistors) and the P-type wells receive NMOS transistors (N-type MOS transistors), as will be seen below. The wells NDW0, NDW1, PDW0, PDW1 are electrically insulated from the substrate 1 and isolated from each other by the fact that their interfaces with the substrate or the interfaces between two wells form blocked junctions PN.

As the substrate is here of P type, the well NDW0 is thus implanted in the substrate and the well PDW0 is implanted in the well NDW0. Similarly, the well NDW1 is implanted in the substrate and the well PDW1 is implanted in the well NDW1.

The predecoder PD comprises predecoding units PD1, PD2. The predecoding unit PD1 receives the operation signal OP, the sector address SAD and the voltage Vpos. It supplies two selection signals SSA, SSB per sector, i.e., SSA0, SSB0 for the sector S0 and SSA1, SSB1 for the sector S1. The signals SSA0, SSB0 are applied to the drivers D0 of the sector S0 and the signals SSA1, SSB1 are applied to the drivers D1 of the sector S1. The predecoding unit PD2 receives the operation signal OP, the line address LAD, and the voltage Vpos, and supplies control line selection signals LS, more particularly "n" signals LS(i) of rank "i". Each signal LS(i) is applied to a driver D0(i) of the same rank in the sector S0 and to a driver D1(i) of the same rank in the sector S1.

The predecoder PD also comprises a predecoding unit PD3 receiving the operation signal OP, the sector address SAD, the voltages Va and Vb, supplying signals PP0 and PP1 for biasing the wells PDW0 and PDW1. Optionally, the predecoder PD also comprises a predecoding unit PD4 receiving the operation signal OP, the sector address SAD and the voltage Vpos, supplying signals NP0 and NP1 for biasing the wells NDW0 and PDW1.

Figure 4:
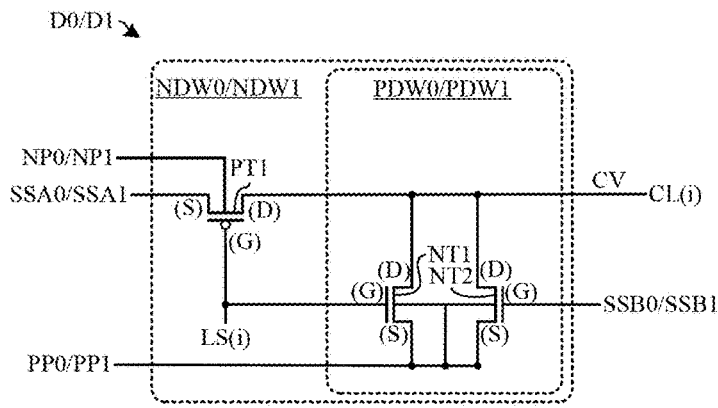
FIG. 4 shows one embodiment of drivers represented in block form in FIG. 3, FIGS. 5A, 5B, 6A, 6B show combinations of electric signals applied to the drivers of FIG. 4.

One embodiment of a driver D0 is represented in FIG. 4. The driver D0 comprises a PMOS transistor PT1 produced in the well NDW0 and two NMOS transistors NT1, NT2 produced in the well PDW0. The well NDW0, in which channel region of the transistor PT1 extends, is biased by the signal NP0. The source S of the transistor PT1 receives the first sector selection signal SSA0. The gate G of the transistor PT1 receives the selection signal LS(i) of the same rank "i" as the control line CL(i) to which the driver D0 is connected. The drain D of the transistor PT1 is coupled to the output of the driver D0. The drains of the transistors NT1, NT2 are also coupled to the output of the driver. The sources S of the transistors NT1, NT2 receive the signal PP0 for biasing the well PDW0, in which the channel region of these transistors extends. The gate G of the transistor NT1 receives the selection signal LS(i) and the gate of the transistor NT2 receives the second sector selection signal SSB0.

The drivers D1 are of the same structure as the drivers D0, but produced in the wells NDW1, PDW1. The description above can be applied to the drivers D1 by replacing the references NDW0, PDW0, NP0, PP0, SSA0, SSB0 with the references NDW1, PDW1, NP1, PP1, SSA1, SSB1.

The memory M1 is configured to execute three types of operations, each corresponding to a value of the operation signal OP:

the erasing of memory cells (OP="ER")
the programming of memory cells (OP="PR"),
the reading of memory cells (OP="RD").

The erasing operation is applied to all the memory cells of a selected sector, designated by the address SAD. On the other hand, the programming or the reading of memory cells only relates to memory cells coupled to a control line CL(i) designated by the address LAD, situated in a sector designated by the address SAD, and belonging to a column designated by the column address CAD. The units of the memory enabling these operations to be implemented, such as programming latches, sense amplifiers, a column decoder, etc., are known by those skilled in the art and are shown on figures described below.

Table 1 below describes, for each type of operation, the voltages applied to the supply terminals (high terminal and low terminal) of the predecoding units PD1, PD2, PD3, PD4 and the voltage Vpmw applied to the well PMW of the memory array. The value "0" represents the ground potential of the memory.

TABLE 1

Voltages for biasing the predecoding units and the well PMW

| OPERATION | Element | High voltage terminal | Low voltage terminal |
|---|---|---|---|
| ER | PD1 | Vpos = Vpp | 0 |
|  | PD2 | Vpos = Vpp | 0 |
|  | PD3 | Va = 0 | Vb = Vneg = −Vpp |
|  | PD4 | Vpos = Vpp | 0 |
|  | PMW | Vpmw = Vpos = Vpp | — |
| PR | PD1 | Vpos = Vpp | 0 |
|  | PD2 | Vpos = Vpp | 0 |
|  | PD3 | Va = Vpos = Vpp | Vb = 0 |
|  | PD4 | Vpos = Vpp | 0 |
|  | PMW | Vpmw = 0 | — |
| RD | PD1 | Vpos = Vrd | 0 |
|  | PD2 | Vpos = Vrd | 0 |
|  | PD3 | Va = Vpos = Vrd | 0 |
|  | PD4 | Vpos = Vrd | 0 |
|  | PMW | Vpmw = 0 | — |

During the erasing or the programming of memory cells, the voltage Vpos is taken to a high positive voltage Vpp and the voltage Vneg is taken to a high negative voltage −Vpp. These voltages Vpp and −Vpp are for example supplied by charge pumps present in the generator VGEN, and are for example of 10V and −10V. During the reading of memory cells, the voltage Vpos is taken to a read voltage Vrd, for example between 1 and 2V. During the erasing of memory cells, the voltage Va is equal to 0 (ground of the circuit) and the voltage Vb is equal to the voltage Vneg, i.e., −Vpp. During the programming or the reading of memory cells, the voltage Va is equal to the voltage Vpos, i.e., Vpp, and the voltage Vb is equal to 0. During the erasing of memory cells, the voltage Vpmw of the well PMW is taken to Vpos, i.e., Vpp. The voltage Vpmw is equal to 0 during the programming or the reading of memory cells.

The voltage values of the signals SSA, SSB, PP, NP supplied by the predecoding units PD1, PD3, PD4 are described by Tables 2 and 3. The signals SSA, SSB, PP, NP are the signals SSA0, SSB0, PP0, NP0 if the sector considered is the sector S0, or the signals SSA1, SSB1, PP1, NP1 if the sector considered is the sector S1. These values vary depending on whether the sector considered is selected (Table 2) or is not selected (Table 3). Only one sector at a time can be selected, the other then not being selected.

TABLE 2

Sector selection signals (selected sector)

| OPERATION | SSA | SSB | PP | NP |
|---|---|---|---|---|
| ER | 0 | 0 | Vneg | 0 |
| PR | Vpos | 0 | 0 | Vpos |
| RD | Vpos | 0 | 0 | Vpos |

TABLE 3

Sector selection signals (sector not selected)

| OPERATION | SSA | SSB | PP | NP |
|---|---|---|---|---|
| ER | Vpos | 0 | 0 | Vpos |
| PR | 0 | Vpos | 0 | 0 |
| RD | 0 | Vpos | 0 | Vpos |

The voltage values of the selection signals LS supplied by the predecoding unit PD2 are described by Table 4 below. These values do not depend on the "selected" or "not selected" state of the sector since each signal LS(i) of rank "i" is applied to all the drivers of the same rank "i" in each sector, irrespective of the state of the sector. These values depend on the line address LAD and on the operation considered, except when erasing a sector. Thus, the terms "designated" and "not designated" in Table 4 mean that the control line CL considered is designated or not by the address LAD, a "designated" line becoming "selected" if the sector on which it depends is itself selected, i.e., designated by the address SAD.

TABLE 4

Line selection signal LS

| OPERATION | CL line state | LS |
|---|---|---|
| ER | Any | 0 |
| PR | Designated | 0 |
|  | Not designated | Vpos |
| RD | Designated | 0 |
|  | Not designated | Vpos |

The voltage values of the control signals CV supplied by the drivers D0, D1 to the control lines CV are described by Tables 5 and 6 below.

Figure 5A:
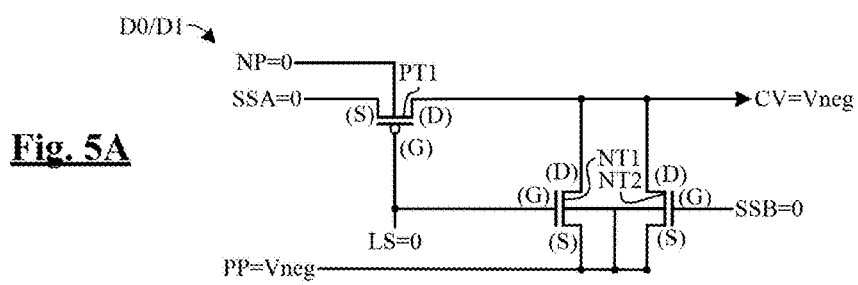
Figure 6A:
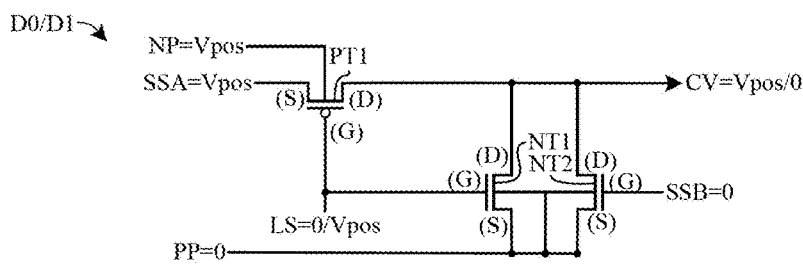

Table 5 describes in connection with FIGS. 5A, 6A (Cf. last column of the table) the values of the control signals CV supplied by the drivers D0 or D1 of a selected sector depending on the operation to be performed and, for the programming or the reading of memory cells, depending on the "selected" (i.e., line designated in a selected sector) or "not designated" state of the control line considered.

TABLE 5

Control voltage CV (selected sector)

| OPER-ATION | CL line state | LS | NP | SSA | SSB | PP | CV | Cf. |
|---|---|---|---|---|---|---|---|---|
| ER | Any | 0 | 0 | 0 | 0 | Vneg | Vneg | FIG. 5A |
| PR | Selected | 0 | Vpos | Vpos | 0 | 0 | Vpos | FIG. 6A |
|  | Not designated | Vpos |  |  |  |  | 0 | FIG. 6A |
| RD | Selected | 0 | Vpos | Vpos | 0 | 0 | Vpos | FIG. 6A |
|  | Not designated | Vpos |  |  |  |  | 0 | FIG. 6A |

Figure 5B:
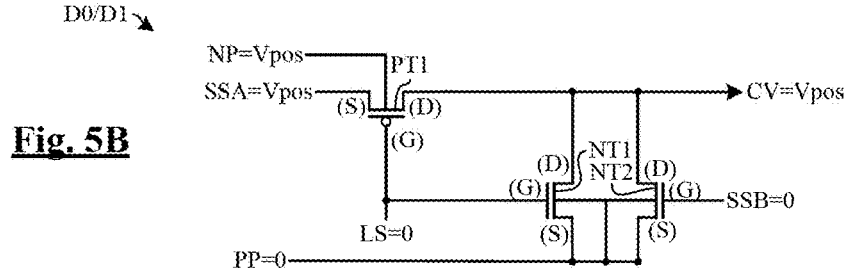
Figure 6B:
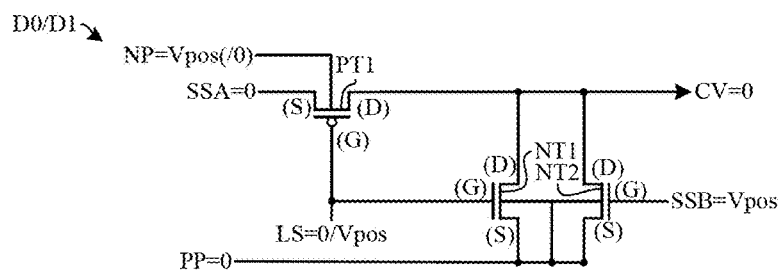

Table 6 describes in connection with FIGS. 5B, 6B the voltage values of the control signals CV supplied by the drivers D0 or D1 of a non-selected sector. These values are independent of the "designated" or "not designated" state of the control line considered (resulting in different values of the signal LS during programming or reading operations, i.e., 0 or Vpos) and only depend on the operation to be performed.

TABLE 6

Control voltage CV (non-selected sector)

| OPERATION | LS | NP | SSA | SSB | PP | CV | Cf. |
|---|---|---|---|---|---|---|---|
| ER | 0 | Vpos | Vpos | 0 | 0 | Vpos | FIG. 5B |
| PR | 0/Vpos | 0 | 0 | Vpos | 0 | 0 | FIG. 6B |
| RD | 0/Vpos | Vpos(/0) | 0 | Vpos | 0 | 0 | FIG. 6B |

Tables 5 and 6 show that the signal NP (NP0 or NP1) for biasing the wells NDW (NDW0 or NDW1) is always equal to the sector selection signal SSA except when reading memory cells. In this case, the signal NP is forced to the value Vpos whereas the signal SSA is equal to 0. Those skilled in the art will understand that this feature is optional and that the signal SSA could, in one alternative, be used as biasing signal NP, the signal NP then being equal to 0 instead of being equal to Vpos in read mode, as indicated in brackets in Table 6. In this case, the predecoding unit PD4 is no longer necessary. Providing the predecoding unit PD4 to supply the signal NP only makes it possible not to subject the potential of the wells NDW0, NDW1 to endless variations in electric potential during the successive reading of memory cells situated in different sectors, which can increase the current consumption of the memory (successive charges and discharges of stray capacitances).

FIGS. 5A, 5B, 6A, 6B show the various configurations of the drivers D0, D1 described in Tables 5 and 6.

On FIG. 5A, the driver D0 or D1 is associated with an erase-selected sector. The transistors NT1, NT2 are on because their gate voltage (0V) is higher than their source voltage (Vneg), whereas the transistor PT1 is off. The driver thus supplies the control line CV with the voltage CV=Vneg=−Vpp. As the well PMW of the memory array MA1 is simultaneously taken to the voltage Vpmw=Vpp by the generator VGEN (Table 1), a voltage difference of 20V appears between the control gate, taken to −10V, and the channel region, taken to 10V, of the floating-gate transistors MC1 in question, and the latter are erased by Fowler Nordheim effect (extraction of electric charges from their floating gate). It will be noted that these transistors can tolerate such a voltage difference, greater than the breakdown voltage that a transistor without any floating gate can tolerate, thanks to the interposition of their floating gate between their control gate and their channel region.

On FIG. 5B, the driver D0 or D1 is associated with a non-erase-selected sector. The transistors NT1, NT2 are off because their gate voltage and their source voltage are equal to 0. The transistor PT1 is on because its channel voltage and its source voltage are equal to Vpp and its gate voltage is equal to 0. The driver thus provides the control line CV with the voltage CV=Vpos=Vpp. As the well PMW of the memory array MA1 is simultaneously taken to the voltage Vpmw=Vpp by the generator VGEN to enable memory cells situated in the other sector to be erased, a zero voltage difference appears between the control gate, taken to 10V, and the channel region, taken to 10V, of the floating-gate transistors in question. Advantageously, they thus do not undergo any erasing stress.

This removal of the erasing stress can enable some embodiments of the memory M1 to be provided without any algorithm for refreshing the memory cells, to obtain low-cost compact memories.

FIG. 6A shows two other configurations of the drivers. In the first configuration, the driver D0 or D1 is associated with a program- or read-selected sector, and with a control line designated by the address LAD (LS=0), thus a program- or read-selected line. The transistor NT2 is off because the signal SSB is equal to 0. The transistor PT1 is on because its gate receives the selection signal LS equal to 0 and its source receives the signal SSA=Vpos (i.e., Vpp in programming mode or Vrd in read mode). The transistor NT1 is off because its gate receives the selection signal LS equal to 0. The driver supplies the control line with the voltage CV=Vpos. Both in programming mode and read mode, a voltage of several Volts is simultaneously applied to bit lines designated by the column address CAD, by means of programming latches or by means of sense amplifiers (not represented on FIG. 3). The floating-gate transistors receiving the voltage Vpos on their control gate and the bit line voltage are passed through by a programming current by hot-electron injection when Vpos=Vpp, or by a read current when Vpos=Vrd.

In the second configuration shown on FIG. 6A, the driver D0 or D1 is always associated with a program- or read-selected sector, but is associated with a control line that is not designated by the address LAD (LS=Vpos). The transistor NT2 is off again because the signal SSB is equal to 0. The transistor PT1 is off and the transistor NT1 is on because the selection signal LS is now equal to Vpos. The driver supplies the control line with the voltage CV=0 because the source of the transistor NT1 receives the signal PP that is equal to 0. The floating-gate transistors coupled to the control line thus remain in the off state and cannot be passed through by the programming current or the read current.

On FIG. 6B, the driver D0 or D1 is associated with a non-program- or read-selected sector and with a line designated or not designated by the signal LS (LS=0 or LS=Vpos). The transistor PT1 is off because its source receives the signal SSA that is equal to 0. The transistor NT2 is on because its gate receives the signal SSB that is equal to Vpos (Vpp or Vrd). As its source receives the signal PP that is equal to 0, the transistor NT2 puts the output of the driver to 0, whatever the value of the signal LS (the transistor NT1 also being on when LS=Vpos). The output of the driver thus supplies the control line with the signal CV=0. The floating-gate transistors coupled to this control line thus remain in the off state and cannot be passed through by the programming current or read current.

Assuming for example that FIG. 5A relates to a driver D0 of the sector S0 and that FIG. 5B relates to a driver D1 of the sector S1, FIGS. 5A and 5B show that the decoder LDEC can simultaneously supply control lines of an erase-selected sector with the voltage Vneg, and control lines of a non-erase-selected sector with the voltage Vpos. The difference between the voltages Vpos and Vneg, here of 20V, is much greater than the breakdown voltage of the transistors PT1, NT1, NT2 of the drivers, which is typically between 10V and 11 V. This result is obtained without exposing these transistors to a voltage greater than 10V, thanks to the provision of the wells PDW0, NDW0, PDW1, NDW1 receiving the drivers of each sector, and to the negative biasing of the well NDW of the driver associated with the selected sector (FIG. 5A) while the well NDW of the driver associated with the non-selected sector is taken to 0V (FIG. 5B).

This advantage is obtained without having to horizontally sectorize the memory array MA1 by means of multiple wells, and also without having to horizontally sectorize the decoding means of the line decoder LDEC, i.e., the predecoder PD, in multiple wells, only the drivers being sectorized. The predecoder PD can thus be produced by means of N- and P-type vertical wells (specific to CMOS technology) that extend side by side opposite the memory array.

FIG. 7 shows one embodiment of the predecoding units PD1, PD2, PD3, PD4 and their implantation on the surface of a semiconductor chip forming the substrate 1 of the memory. The predecoding units comprise a common logical low-voltage predecoding unit LPD134 and voltage conversion units HVPD1, HVPD3, HVPD4. The logical unit LPD134 receives a supply voltage Vcc for supplying the memory and performs the actual predecoding of the sector address SAD. The voltage conversion units HVPD1, HVPD3, HVPD4 are powered by the voltages Vpos, Va, Vb and are controlled by the operation signal OP, to supply, using the signals supplied by the logical unit LPD134, the signals SSA0, SSB0, SSA1, SSB1, PP0, PP1, NP0, NP1. As the memory described here comprises only two sectors, the predecoding unit LPD134 only uses the most significant address bit of the word address WAD as sector address SAD. This address bit ensures the selection of the sector S0 and the predecoding unit LPD134 comprises an inverter gate 11 supplying an inverted bit for selecting the sector S1. Furthermore, the conversion units HVPD1, HVPD3, HVPD4 can be produced simply from level shifters LS receiving the sector S0 selection bit or the sector S1 selection bit, controlled by the operation signal OP.

Similarly, the predecoding unit PD2 comprises a logical low-voltage predecoding unit LPD2 and a voltage conversion circuit HVPD2. The logical unit LPD2 is powered by the voltage Vcc and performs the actual predecoding of the line address LAD. The voltage conversion circuit HVPD2 is powered by the voltage Vpos and is controlled by the operation signal OP, to supply, from low-voltage signals LS' supplied by the logical unit LPD2, the line selection signals LS.

This line decoder structure LDEC can thus be produced by implanting the units HVPD1, HVPD3, HVPD4, vertically and in parallel to the memory array MA1, as shown on FIG. 7, without the need to provide a horizontal sectorization to form independent line decoders isolated from each other. As shown very schematically on FIGS. 8A, 8B, 8C, the units HVPD1, HVPD2, HVPD4 comprise groups of NMOS transistors NT (shown by a single transistor) produced on the substrate 1 and groups of PMOS transistors produced in an N-type well, respectively 21, 22, 24, implanted in the substrate. As shown very schematically on FIG. 8D, the unit HVPD3 comprises groups of PMOS transistors PT produced in an N-type well 23 implanted in the substrate, and groups of NMOS transistors NT produced in a well 33 that is produced in the well 23. Although the wells 23, 33 or the groups of transistors PT, NT are represented one above the other on FIGS. 8A to 8D, they can be arranged side by side on the substrate.

Figure 9:
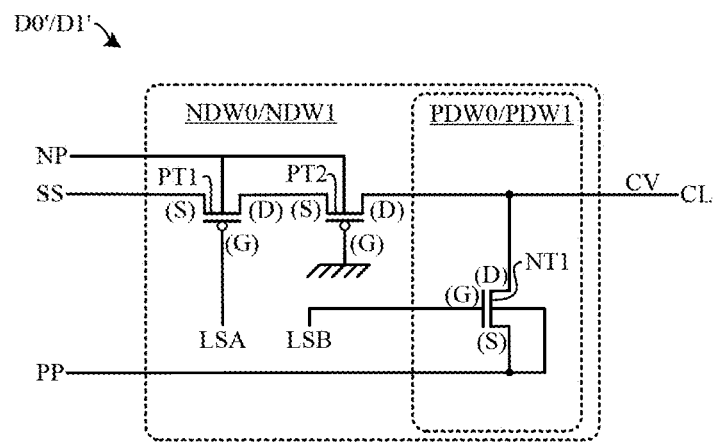
FIG. 9 shows another embodiment of a driver according to the present disclosure.

It will be understood by those skilled in the art that a memory according to the present disclosure is susceptible of various embodiments. In particular, the structure of the drivers D0/D1 depends on the choice of the sector selection, well biasing and line selection signals, this choice being made when designing the decoder. Other choices can be made to achieve the same result or a similar result. As an example, FIG. 9 shows one alternative D0', D1' of the drivers using only a single sector selection signal SS instead of the selection signals SSA, SSB, and two line selection signals LSA, LSB instead of the line selection signal LS. The drivers D0' or D1' comprise for example two PMOS transistors PT1, PT2 in series instead of only one, and a single NMOS transistor NT1 instead of two (a second transistor NT2 in parallel with NT1 could also be provided). The selection signal SS is applied to the source of the transistor PT1, the drain of which is connected to the source of the transistor PT2. The selection signal LSA is applied to the gate of the transistor PT1, the gate of the transistor PT2 being coupled to the ground. The signal LSB is applied to the gate of the transistor NT1, the drain of which is coupled to the drain of the transistor PT2 and to the output of the driver D0' or D1', and the source of which receives the signal PP. This alternative driver structure optionally enables a negative voltage CV to be applied on the control line CL during a programming step, when the sector associated with the driver is not program-selected. This ensures for example that floating-gate transistors having an altered threshold voltage close to 0 will not become on under the effect of the programming voltage applied to their bit line.

In other embodiments, in particular the one shown on FIG. 2, the memory M1 may comprise more than two sectors. The sector address SAD is then made up of two or more most significant bits of the word address. Each signal LS(i) is applied to a driver of the same rank "i" in each group and the predecoding units PD1, PD2 are configured to also supply selection signals SSA, SSB of the other sectors (for example SSA3, SSB3, SSA4, SSB4, etc.). Similarly, the predecoding units PD3, PD4 then supply signals for biasing the wells PDW, NDW in which the other groups of drivers are produced.

Figure 10:
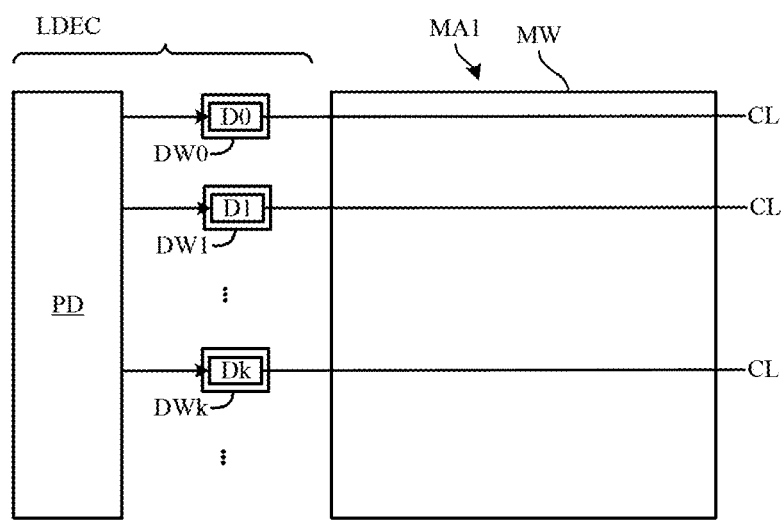
FIG. 10 shows another embodiment of a memory according to the present disclosure.

In still other embodiments, the memory array MA1 is page-erasable instead of being sector-erasable. In this case, each control line CL is attached to a dedicated driver that is made in a well specific to it. Such an embodiment is schematically shown on FIG. 10. Compared to the embodiment in FIG. 2 or 3, this embodiment amounts to considering that each control line CL forms a sector and to multiplying the number of drivers (D0, D1 . . . Dk . . . ), each one being arranged in a dedicated well (DW0, DW1 . . . DWk . . . ), so that there are as many drivers as control lines CL. In this case, the predecoder PD ensures the individual selection of the drivers using a complete line address including the most significant bit or bits of the word address. It is no longer necessary to provide sector predecoding units and line predecoding units.

Independently of the initial objective, relating to the removal of the erasing stress, a line decoder according to the present disclosure is susceptible of various applications in which it is desirable to simultaneously apply to a memory array negative and positive voltages having a voltage difference greater than a breakdown voltage of transistors.

Figure 11:
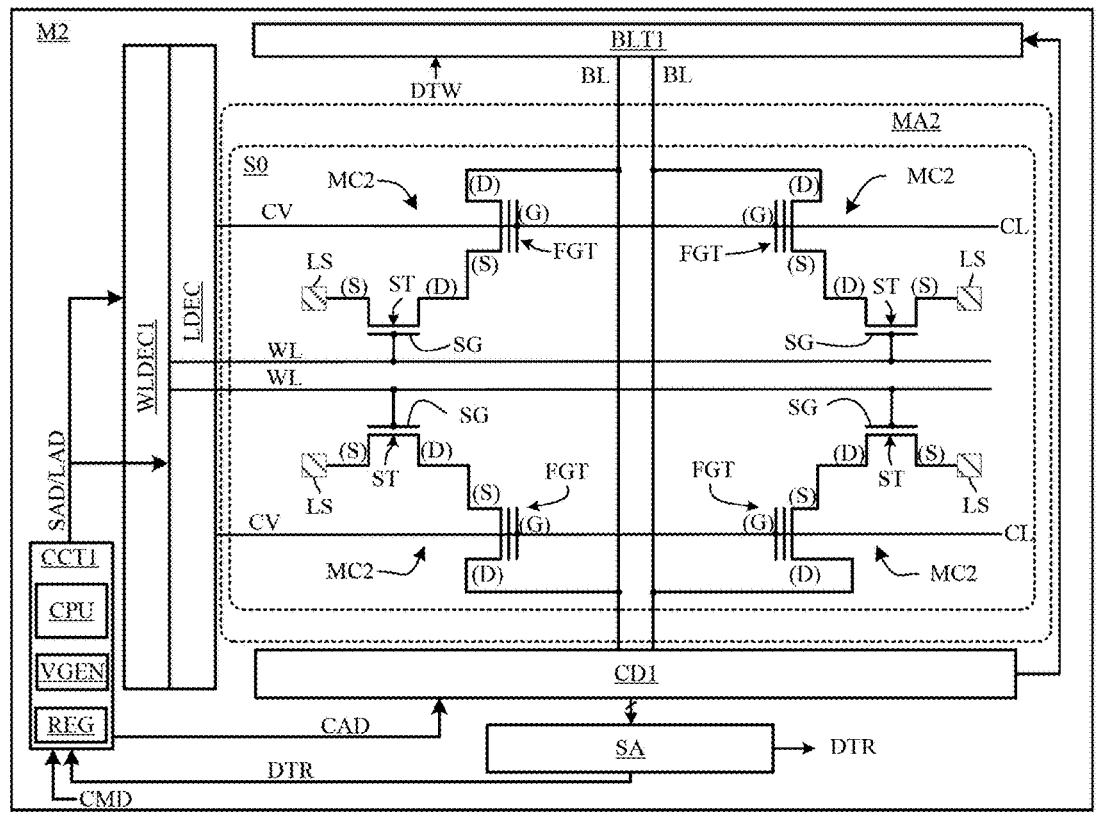
FIG. 11 shows another embodiment of a memory according to the present disclosure.

Furthermore, such a line decoder may be used with various other types of memory cells. As an example, FIG. 11 shows a memory M2 according to the present disclosure comprising a memory array MA2 with several sectors (only a portion of the first sector S0 being represented) comprising memory cells MC2 each having a floating-gate transistor FGT and a select transistor ST. The control gate of the floating-gate transistor FGT is coupled to a control line CL, and the selection gate SG of the select transistor is coupled to a word line WL. The line decoder of the memory comprises the line decoder LDEC previously described and a word line decoder WLDEC1 that applies word line selection voltages to the word lines WL, while the decoder LDEC applies gate control voltages CV to the control lines CL.

The memory M2 also comprises an operation control circuit CCT1, a group of sense amplifiers SA coupled to the bit lines BL of the memory array through a column decoder CD1, and a group of programming latches BLT1 coupled to the bit lines. The operation control circuit CCT1 comprises a central processing unit CPU, the voltage generator VGEN already described, and a bank of address and data registers REG. The circuit CCT1 receives commands CMD for reading, programming or erasing memory cells, and supplies the group of programming latches BLT1 with data DTW to be written in the memory array, the column decoder CD1 with a column address CAD, and the decoders WLDEC1 and LDEC with the sector SAD and line LAD addresses. The group of sense amplifiers SA supplies the circuit CCT1 with data DTR read in the memory array.

Figure 12:
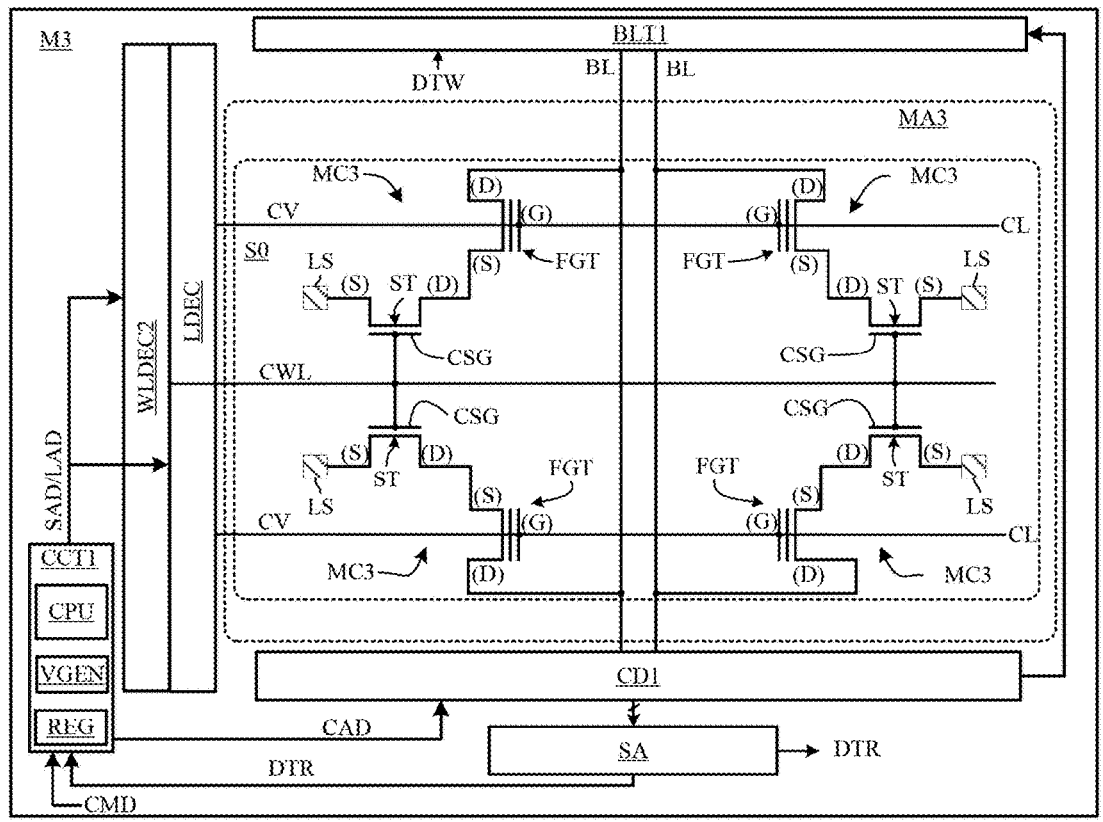
FIG. 12 shows another embodiment of a memory according to the present disclosure.

FIG. 12 shows one alternative M3 of the memory M2 comprising memory cells MC3 that differ from the previous ones in that they are grouped together in pairs. The select transistors ST of the memory cells of a same pair share the same selection gate, which becomes a common selection gate CSG and is coupled to a common word line CWL. The word line decoder WLDEC1 is replaced with a decoder WLDEC2 configured to select the common word line CWL corresponding to the sector SAD and line LAD address received. The common selection gate CSG may be an embedded vertical gate produced in a trench made in the substrate.

Figure 13:
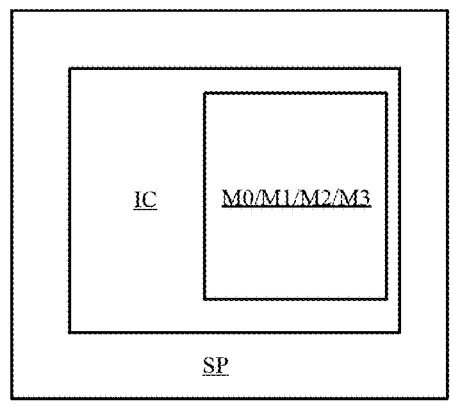
FIG. 13 shows a device equipped with an integrated circuit according to an embodiment of the present disclosure.

A memory according to the present disclosure can enable various electronic devices to be produced that require a data memory and/or a program memory. An example of such a device is represented in FIG. 13. The device comprises an integrated circuit IC on semiconductor chip integrating a memory M0, M1, M2 or M3 according to the present disclosure. The integrated circuit IC can receive various other components, such as a microcontroller for example. The semiconductor chip is arranged on a support SP, for example an interconnection support, a printed circuit board, a card, etc.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A non-volatile memory, comprising:
   a semiconductor substrate;
   a memory array including a plurality of sectors of memory cells formed in a memory array well in the semiconductor substrate, each sector including a plurality of rows of memory cells; and
   a line decoder including a plurality of drivers, each driver coupled to the plurality of memory cells in a corresponding one of the plurality of sectors and each one of the drivers formed in a respective driver well in the semiconductor substrate, each of the driver wells being electrically isolated from the other driver wells and electrically isolated from the memory array well.

2. The non-volatile memory of claim 1, wherein each driver well has a first conductivity and each driver comprises:
   at least one MOS transistor of a second conductivity type,
   a well of the second conductivity type implanted in the driver well of the first conductivity type, and
   at least one MOS transistor of the first conductivity type formed in the well of the second conductivity type.

3. The non-volatile memory of claim 1, wherein the line decoder further comprises a predecoder formed in a single well in the semiconductor substrate.

4. The non-volatile memory of claim 3, wherein the predecoder is configured to generate at least one signal for biasing each driver well.

5. The non-volatile memory of claim 3, wherein the predecoder is configured to generate selection signals of variable polarity that are applied to the plurality of drivers, and wherein the plurality of drivers is configured to combine the selection signals to generate control signals of variable polarity to drive the rows of memory cells based on the selection signals.

6. The non-volatile memory of claim 5 further comprising a voltage generator circuit configured to generate an erase voltage having a first polarity and the voltage generator circuit configured to apply, during an erasing of a row of memory cells, the erase voltage to the memory array well.

7. The non-volatile memory of claim 6, wherein the plurality of drivers are configured, during the erasing of a row of memory cells, to apply to the row of memory cells being erased, an erase signal having a second polarity that is the opposite of the first polarity, and wherein the plurality of drivers are further configured to apply to another row of memory cells an erasing stress neutralization signal having the first polarity.

8. The non-volatile memory of claim 6, wherein each of the drivers includes a plurality of transistors and wherein the predecoder is configured to generate the selection signals so that a difference between the erasing stress neutralization signal and the erase signal is greater than a breakdown voltage of the transistors of the drivers.

9. An electronic device, comprising:
an integrated circuit including at least one non-volatile memory, each of the at least one non-volatile memory including;
a semiconductor substrate;
a memory array including a plurality of sectors of memory cells formed in a memory array well in the semiconductor substrate, each sector including a plurality of rows of memory cells; and
a line decoder including a plurality of drivers, each driver coupled to the plurality of memory cells in a corresponding one of the plurality of sectors and each one of the drivers formed in a respective driver well in the semiconductor substrate, each of the driver wells being electrically isolated from the other driver wells and electrically isolated from the memory array well.

10. The electronic device of claim 9 further comprising a support for the integrated circuit.

11. The electronic device of claim 10, wherein the support comprises one of a printed circuit board, an interconnection support, and a card.

12. The electronic device of claim 11, wherein each of the at least one non-volatile memory is formed in the same semiconductor chip.

13. The electronic device of claim 11, wherein each of the at least one non-volatile memory is formed on a different semiconductor chip.

14. The electronic device of claim 9, wherein each non-volatile memory cell comprises a floating gate transistor.

15. The electronic device of claim 9, wherein the line decoder further comprises a predecoder formed in a single well in the semiconductor substrate and configured to generate a signal for biasing each driver well.

16. The electronic device of claim 15, wherein the predecoder is configured to generate selection signals of variable polarity that are applied to the plurality of drivers, and wherein the plurality of drivers is configured to combine the selection signals to generate control signals of variable polarity to drive the rows of memory cells based on the selection signals.

17. The electronic device of claim 16 further comprising a voltage generator circuit configured to generate an erase voltage having a first polarity and the voltage generator circuit configured to apply, during an erasing of a row of memory cells, the erase voltage to the memory array well.

18. An electronic device, comprising:
an integrated circuit including at least one memory, each of the at least one memory including;
a semiconductor substrate;
a memory array including a plurality of sectors of memory cells formed in a memory array well in the semiconductor substrate, each sector including a plurality of rows of memory cells; and
a line decoder including a plurality of drivers, each driver coupled to the plurality of memory cells in a corresponding one of the plurality of sectors and each one of the drivers formed in a respective driver well in the semiconductor substrate, each of the driver wells being electrically isolated from the other driver wells and electrically isolated from the memory array well, and each driver well having a first conductivity type and including a well of the second conductivity type formed in the driver well of the first conductivity type, and each driver further including at least one MOS transistor of a second conductivity type and at least one transistor of the first conductivity type.

19. The electronic device of claim 18, wherein for each driver well the at least one MOS transistor of the first conductivity type is formed in the well of the second conductivity type formed in the driver well.

* * * * *